United States Patent [19]
Fujii

[11] Patent Number: 6,020,784
[45] Date of Patent: Feb. 1, 2000

[54] FM DEMODULATION CIRCUIT

[75] Inventor: Tomohiro Fujii, Tokyo, Japan

[73] Assignee: NEC Corporation, Tokyo, Japan

[21] Appl. No.: 08/972,928

[22] Filed: Nov. 18, 1997

[30] Foreign Application Priority Data

Nov. 20, 1996 [JP] Japan ................................. 8-309286

[51] Int. Cl.⁷ .............................. H03D 3/00; H03D 3/02
[52] U.S. Cl. ..................... 329/318; 329/321; 329/336; 329/337; 455/210; 455/214; 455/337
[58] Field of Search .................................. 329/315, 318, 329/321, 327, 336, 337; 455/205, 210, 211, 214, 337

[56] References Cited

U.S. PATENT DOCUMENTS 3,667,060  5/1972  Avins ....................................... 329/103

FOREIGN PATENT DOCUMENTS

| 156011/92 | 5/1992 | Japan . |
| 204901/94 | 7/1994 | Japan . |
| 2 089 152 | 6/1982 | United Kingdom . |
| 2 122 440 | 1/1984 | United Kingdom . |

*Primary Examiner*—David Mis
*Attorney, Agent, or Firm*—Scully, Scott, Murphy & Presser

[57] ABSTRACT

An FM demodulation circuit includes a phase conversion circuit which converts a frequency variation of an input signal into a phase variation and has a variable conversion characteristic, and a control current source circuit which outputs, when the level of the input signal drops lower than a predetermined level, control current to vary the conversion characteristic of the phase conversion circuit so that the demodulation sensitivity may be raised.

20 Claims, 12 Drawing Sheets

| A | B | Y |
|---|---|---|
| 0 | 0 | 1 |
| 1 | 0 | 0 |
| 0 | 1 | 0 |
| 1 | 1 | 1 |

FM DEMODULATION CIRCUIT

BACKGROUND OF THE INVENTION

1. Field of the Invention

This invention relates to an FM(frequency modulation) demodulation circuit which demodulates a frequency modulated signal, and more particularly to an FM demodulation circuit formed from a quadrature detection circuit.

2. Description of the Related Art

FM demodulation circuits for demodulating a frequency modulated signal include a delay detection circuit, a pulse counting detection circuit, a quadrature detection circuit and so forth. In recent years, a quadrature detection circuit which makes use of a resonance circuit is used principally.

For a quadrature detection circuit, two circuit constructions are-available including a circuit which makes use of a frequency to phase characteristic of a resonance circuit and another circuit which makes use of a frequency to impedance characteristic of a resonance circuit. The former quadrature detection circuit which makes use of a frequency to phase characteristic of a resonance circuit is used popularly.

Of the FM demodulation circuits which include a quadrature detection circuit, a conventional quadrature detection circuit which makes use of a frequency to phase characteristic of a resonance circuit is described with reference to FIGS. 1 to 5.

Referring to FIG. 1, the conventional quadrature detection circuit which makes use of a frequency to phase characteristic of a resonance circuit includes amplitude limiting circuit 101 for limiting the level of frequency modulated input signal $f_{in}$ to a predetermined level, phase conversion circuit 102 for outputting signal $f_A$ having the same phase as that of an output signal of amplitude limiting circuit 101 and signal $f_B$ obtained by converting a frequency variation of the output signal of amplitude limiting circuit 101 into a phase variation, multiplier 103 for outputting a signal of a phase difference between two signals $f_A$ and $f_B$ outputted from phase conversion circuit 102, and low-pass filter (hereinafter referred to as LPF) 104 for integrating the output signal of multiplier 103.

Phase conversion circuit 102 includes resonance circuit 105 having series resonance frequency $f_s$ and parallel resonance frequency $f_p$ in a frequency characteristic thereof, resistor R101 connected in parallel to resonance circuit 105, and capacitance C101 connected in series to resonance circuit 105 and resistor R101 and inserted in a line along which signal $f_B$ is transmitted.

Resonance circuit 105 is formed from a well-known LC resonance circuit, ceramic discriminator or like circuit.

As shown in FIG. 2A, since resonance circuit 105 exhibits an inductance characteristic in frequency region $f_{w1}$ which satisfies series resonance frequency $f_s \leq f_{w1} \leq$ parallel resonance frequency $f_p$, the phase of the output voltage leads by 90 degrees with respect to the phase of the input voltage. On the other hand, since resonance circuit 105 exhibits a capacitance characteristic in frequency regions $f_{w2}$ and $f_{w3}$ which satisfy $f_{w2} \leq f_s$ and $f_p \leq f_{w3}$, respectively, the phase of the output voltage lags by 90 degrees with respect to the phase of the input voltage.

Here, if amplitude limiting circuit 101 is connected in parallel to resonance circuit 105 as shown in FIG. 1, then such a frequency to phase characteristic as illustrated in FIG. 2B can be obtained. Where such a frequency to phase characteristic as illustrated in FIG. 2B is utilized, if the frequency of input signal $f_{in}$ changes to $f_1$, $f_2$ and $f_3$, then the phase of the output voltage of resonance circuit 105 changes to $\theta_1$, $\theta_2$ and $\theta_3$, respectively. The inclination of the frequency to phase characteristic is determined by the resistance value of resistor R101 connected in parallel to resonance circuit 105. It is to be noted that, for resistor R101, a fixed resistor is used normally.

Multiplier 103 is usually formed from such an EX-NOR (exclusive OR inverting outputting) circuit as shown in FIG. 3. The relationship of output Y to inputs A and B of the EX-NOR circuit is indicated by the following table.

| A | B | Y |
|---|---|---|
| 0 | 0 | 1 |
| 1 | 0 | 0 |
| 0 | 1 | 0 |
| 1 | 1 | 1 |

In the construction described above, an output signal of amplitude limiting circuit 101 is inputted to phase conversion circuit 102. Phase conversion circuit 102 outputs signal $f_A$ of the same phase as that of the output signal of amplitude limiting circuit 101 and signal $f_B$ obtained by converting the frequency variation of the output signal into a phase variation.

Here, when the frequency of input signal $f_{in}$ is $f_1$, $f_2$ and $f_3$, the phase of signal $f_B$ exhibits such relationships to the phase of signal $f_A$ as illustrated in FIG. 4 due to the delay (−90 degrees) of the phase by capacitance C101 and the displacement in phase by resonance circuit 105. In this instance, signal $f_Y$ of the phase difference between two signals $f_A$ and $f_B$ is outputted from multiplier 103. This output signal $f_Y$ of multiplier 103 is integrated by LPF 104. Consequently, such a demodulation output characteristic as illustrated in FIG. 5 can be obtained from the FM demodulation circuit.

The inclination of the demodulation output characteristic of the FM demodulation circuit is usually called demodulation sensitivity. The demodulation sensitivity is indicated by the inclination of the frequency to phase characteristic of the phase conversion circuit 102, and the inclination is determined by the value of resistor R101 connected in parallel to resonance circuit 105.

Next, a quadrature detection circuit of the bridge type which makes use of a frequency to impedance characteristic of a resonance circuit is described with reference to FIGS. 6 to 9.

Referring to FIG. 6, the conventional quadrature detection circuit which makes use of a frequency to impedance characteristic of a resonance circuit includes amplitude limiting circuit 111 for limiting the level of frequency modulated input signal $f_{in}$ to a predetermined level, phase conversion circuit 112 for outputting signal $f_A$ of the same phase as that of an output signal of amplitude limiting circuit 111 and signal $f_B$ obtained by converting the frequency variation of the output signal of amplitude limiting circuit 111 into a phase variation, multiplier 113 for outputting a signal of a phase difference between two signals $f_A$ and $f_B$ outputted from phase conversion circuit 112, and LPF 114 for integrating an output signal of multiplier 113.

Phase conversion circuit 112 includes resistors R111, R112 and R113, and resonance circuit 115 having series resonance frequency $f_s$ and parallel resonance frequency $f_p$ in a frequency characteristic thereof. A bridge circuit is formed from resistors R111 to R113 and resonance circuit 115.

Resonance circuit 115 is formed, similarly to a quadrature detection circuit which makes use of a frequency to phase characteristic of a resonance circuit, from an LC resonance circuit having series resonance frequency $f_s$ and parallel resonance frequency $f_p$ in a frequency characteristic thereof, a ceramic discriminator or some other suitable device.

In the construction described above, resonance circuit 115 exhibits an inductance characteristic in a frequency region between series resonance frequency $f_s$ and parallel resonance frequency $f_p$. Where the impedance of resonance circuit 115 in this frequency region is represented by $j\omega L$, phase conversion circuit 112 is equivalent to such a bridge circuit as shown in FIG. 7.

Here, by setting R111=R112=R113=R with frequency f at which $(f_s+f_p)/2$ is satisfied and placing $j\omega L=R$, current $I_1$ flowing through terminals a, b and c and current $I_2$ flowing through terminals a, d and b are given by the following expressions:

$$I_1 = V_{in}/(R111+R112) = V_{in}/2R$$

$$I_2 = V_{in}/(R113+j\omega L) = V_{in}/2R$$

As seen in FIG. 8, current $I_2$ is delayed in phase by $\psi_d = \tan^{-1}(\omega L/R)$ from $V_{in}$.

Accordingly, as seen in FIG. 9, as the frequency ($\omega=2\pi f$) of input signal $f_{in}$ varies, then the value of the impedance ($j\omega L$) of resonance circuit 115 varies and the phase difference between $V_{in}$ and current $I_2$, also the phase difference between $V_{in}$ and $V_{out}$ of the bridge circuit shown in FIG. 7 varies.

Consequently, similarly to a quadrature detection circuit which makes use of a frequency to phase characteristic of a resonance circuit, signal $f_B$ whose phase varies in response to a frequency variation of input signal $f_{in}$ can be obtained.

Multiplier 113 is formed from an EX-NOR circuit and outputs a signal of a phase difference between two signals $f_A$ and $f_B$. By integrating this output signal $f_Y$ of multiplier 113 by LPF 114, such a demodulation output signal as illustrated in FIG. 5 can be obtained similarly to a quadrature detection circuit which makes use of a frequency to phase characteristic of a resonance circuit.

Where a resistor (impedance of the real part) as a series resonance circuit element of resonance circuit 115 is absent, since Q of resonance circuit 115 is infinite, the impedance of resonance circuit 115 at series resonance frequency $f_s$ is zero (0) while the impedance of resonance circuit 115 at parallel resonance frequency $f_p$ is infinity ($\infty$). Since Q can be reduced where resonance circuit 115 has, in the inside thereof, a resistor which serves as a series resonance circuit element, resonance circuit 115 is usually used with this construction. Q of resonance circuit 115 is determined by the value of the resistor which serves as the series resonance circuit element, and the demodulation sensitivity is determined by Q of resonance circuit 115.

In such conventional FM demodulation circuits as described above, since the level of input signal $f_{in}$ is limited to a predetermined level by an amplitude limitation circuit, it is considered that the demodulation sensitivity is fixed irrespective of the level of input signal $f_{in}$.

Actually, however, there is a problem in that, when the input level becomes low (when the electric field becomes weak), the demodulation sensitivity is so lowered by an influence of the NF of the receiver and so forth that a received signal cannot be demodulated accurately.

Further, in order to raise the thus lowered demodulation sensitivity, a circuit element which forms the resonance circuit must be exchanged.

By the way, a technique of raising the demodulation sensitivity when the electric field of an FM demodulation circuit is weak is disclosed in Japanese Patent Laid-Open Application No. 204901/94 and Japanese Patent Laid-Open Application No. 156011/92. However, those documents do not disclose any technique of raising the demodulation sensitivity of a quadrature detection circuit, which is employed very frequently by receivers in recent years.

SUMMARY OF THE INVENTION

Therefore, it is an object of the present invention to provide an FM demodulation circuit which prevents insufficient demodulation when the electric field is weak.

In order to attain the object described above, according to the present invention, there is provided an FM demodulation circuit wherein a demodulation sensitivity thereof is raised when a level of a frequency modulated input signal drops, comprising a phase conversion circuit for outputting a first output signal having the same phase as that of the input signal and a second output signal obtained by converting a frequency variation of the input signal into a phase variation, the phase conversion circuit allowing variation of a characteristic of the phase variation with respect to the frequency variation, a multiplier for outputting a signal of a phase difference between the first output signal and the second output signal outputted from the phase conversion circuit, a low-pass filter for integrating the output signal of the multiplier to form a demodulation signal and outputting the demodulation signal, an electric field strength detection circuit for detecting a level of the input signal, and a control current source circuit for outputting, when the level of the input signal detected by the electric field strength detection circuit drops lower than a predetermined level, control current to vary the characteristic of the phase variation with respect to the frequency variation to raise the demodulation sensitivity.

With the FM demodulation circuit constructed in such a manner as described above, when the level of the input signal drops, the characteristic of the phase variation with respect to the frequency variation of the second output signal outputted from the phase conversion circuit is varied by the control current outputted from the control current source circuit so that the demodulation sensitivity may be raised. Consequently, insufficient demodulation of the FM demodulation circuit is prevented.

The above and other objects, features and advantages of the present invention will become apparent from the following description with reference to the accompanying drawings which illustrate examples of the present invention.

DETAILED DESCRIPTION OF THE PREFERRED EMBODIMENTS

In the following, the present invention is described with reference to the drawings.

(First Embodiment)

An FM demodulation circuit of the first embodiment has a construction wherein it includes, in addition to a conventional quadrature detection circuit, an electric field strength detection circuit for detecting the level (electric field strength) of a frequency modulated input signal, and a control current source circuit for outputting control current to vary the characteristic of the phase conversion circuit with the level of the input signal detected by the electric field strength detection circuit. Further, the FM demodulation circuit of the present invention is different from the conventional quadrature detection circuit in that the characteristic of the phase conversion circuit can be varied by the control current outputted from the control current source circuit. The other construction of the FM demodulation circuit of the present invention is similar to that of the conventional quadrature detection circuit.

Figure 10:
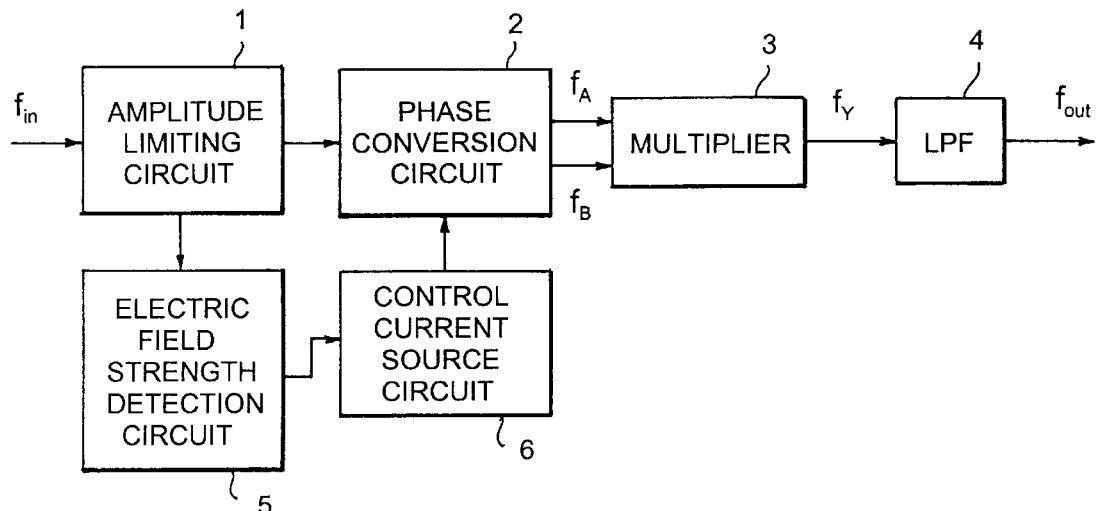
FIG. 10 is a block diagram showing a construction of a first embodiment of the FM demodulation circuit of the present invention.

Referring to FIG. 10, the FM demodulation circuit of the first embodiment is includes amplitude limiting circuit 1 for limiting the level of frequency modulated input signal $f_{in}$ to a predetermined level, phase conversion circuit 2 for outputting signal $f_A$ of the same phase as that of an output signal of amplitude limiting circuit 1 and signal $f_B$ obtained by converting the frequency variation of the output signal of amplitude limiting circuit 1 into a phase variation, multiplier 3 for outputting a signal of a phase difference between two signals $f_A$ and $f_B$ outputted from phase conversion circuit 2, LPF 4 for integrating output signal $f_Y$ of multiplier 3, electric field strength detection circuit 5 for detecting the level (electric field strength) of input signal $f_{in}$, and control current source circuit 6 for outputting, when the level of input signal $f_{in}$ drops, control current to vary the characteristic of phase conversion circuit 2 to raise the demodulation sensitivity.

In such a construction as described above, frequency modulated input signal $f_{in}$ is inputted to phase conversion circuit 2 after the level thereof is inputted to the predetermined level by amplitude limiting circuit 1. From phase conversion circuit 2, signal $f_A$ of the same phase as that of the output signal of amplitude limiting circuit 1 and signal $f_B$ whose phase varies in response to a frequency variation of the output signal of amplitude limiting circuit 1.

Multiplier 3 is formed from, for example, an EX-NOR circuit and outputs a signal of a phase difference between signals $f_A$ and $f_B$. The output signal of multiplier 3 is passed through LPF 4 so that the signal of the phase difference between signals $f_A$ and $f_B$ is integrated by LPF 4, and outputted as demodulation signal $f_{out}$ from LPF 4.

Further, input signal $f_{in}$ is inputted to electric field strength detection circuit 5 through amplitude limiting circuit 1. Electric field strength detection circuit 5 outputs a voltage (or current) which increases in inverse proportion (or in proportion) to the level of input signal $f_{in}$.

If it is detected from the output signal of electric field strength detection circuit 5 that the level of input signal $f_{in}$ has become lower than the predetermined value, then control current source circuit 6 varies the output current thereof to vary the characteristic of phase conversion circuit 2 so that the demodulation sensitivity may be raised.

By construction of such an FM demodulation circuit as described above, even if the level of input signal $f_{in}$ drops, since the characteristic of phase conversion circuit 2 is varied by the control current outputted from control current source circuit 6 to raise the demodulation sensitivity, insufficient demodulation by some drop of the demodulation sensitivity is prevented.

(Second Embodiment)

Figure 11:
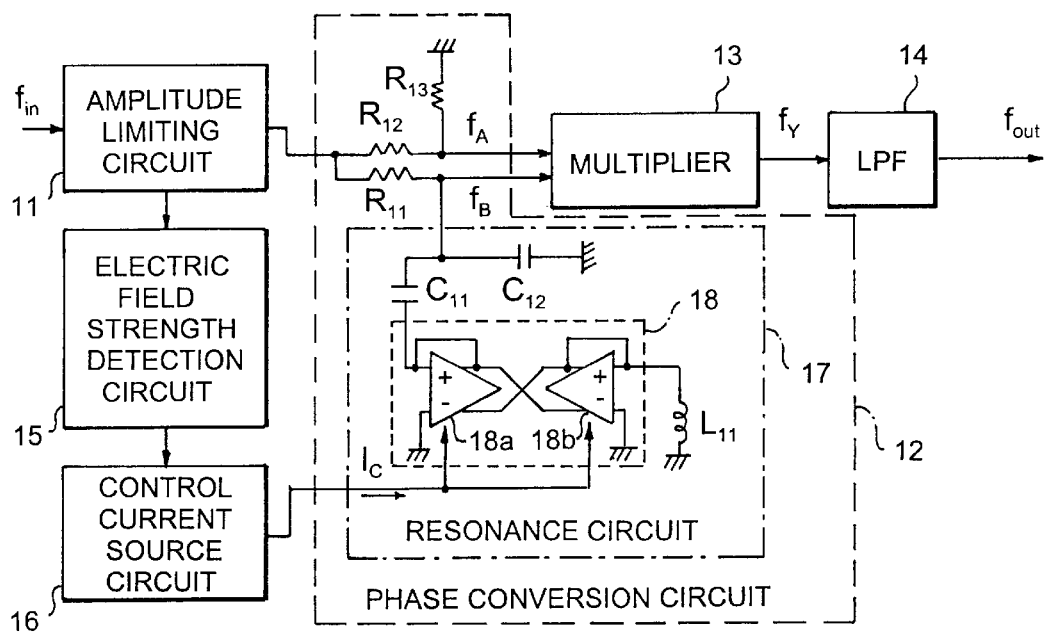
FIG. 11 is a block diagram showing a construction of a second embodiment of the FM demodulation circuit of the present invention.

Referring to FIG. 11, a FM demodulation circuit of the second embodiment is improvement in or relating to a quadrature detection circuit which makes use of a frequency to impedance characteristic of a resonance described in connection with the conventional example. Accordingly, since the constructions and operations of amplitude limiting circuit 11, multiplier 13 and LPF 14 are similar to those of the conventional circuit, description thereof is omitted here.

Phase conversion circuit 12 includes resistors R11, R12 and R13, and resonance circuit 17. A bridge circuit is formed from resistors Rll to R13 and resonance circuit 17.

Resonance circuit 17 is formed from capacitance C11, inductance L11, and equivalent resistor 18 formed from two transconductance amplifiers (hereinafter referred to as OTAs), connected in series, and capacitance C12 connected in parallel to them.

Figure 12:
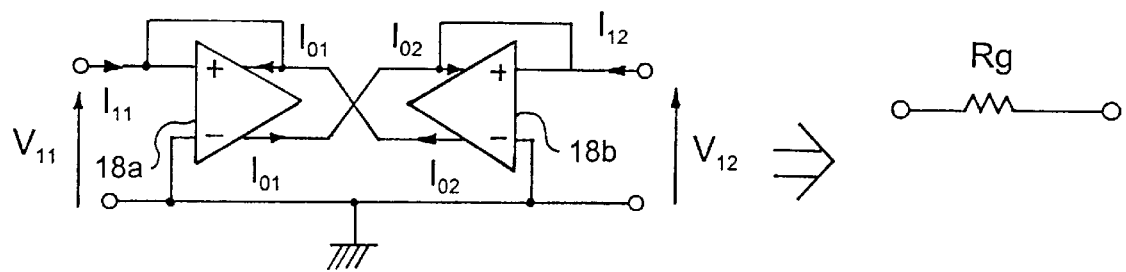
FIG. 12 is a circuit diagram showing a construction of an equivalent resistor of the FM demodulation circuit shown in FIG. 11.

Referring to FIG. 12, equivalent resistor 18 has a negative input terminal and a positive input terminal, and a first output terminal and a second output terminal which is an inverted output to that of the first output terminal, and is formed from first OTA 18a and second OTA 18b which have transconductances which can be varied by control current IC.

The first output terminal of first OTA 18a is fed back to the positive input terminal and is connected to the second output terminal of second OTA 18b, and the first terminal of second OTA 18b is fed back to the positive input terminal and is connected to the second output terminal of first OTA 18a. Further, the negative input terminals of first OTA 18a and second OTA 18b are grounded.

Here, where the input voltage inputted to the positive input terminal of first OTA 18a is represented by $V_{11}$, the input voltage inputted to the positive input terminal of second OTA 18b by $V_{12}$ and the transconductance of each OTA by G, current $I_{o1}$ which flows to the output terminal of first OTA 18a and current $I_{o2}$ which flows to the output terminal of second OTA 18b can be represented by $$I_{o1}=GV_{11} \quad (1)$$

$$I_{o2}=GV_{12} \quad (2)$$

Further, since input current $I_{11}$ to first OTA 18a is $$I_{11}=I_{o1}-I_{o2} \quad (3)$$

it can be represented as $$I_{11}=G(V_{11}-V_{12}) \quad (4)$$

Where transconductance G is represented using impedance Rg, $$G=1/Rg \quad (5)$$

Accordingly, $$Rg=(V_{11}-V_{12})/I_{11} \quad (6)$$

Consequently, equivalent resistor 18 shown in FIG. 12 is equivalent to a resistor having impedance Rg.

Figure 13:
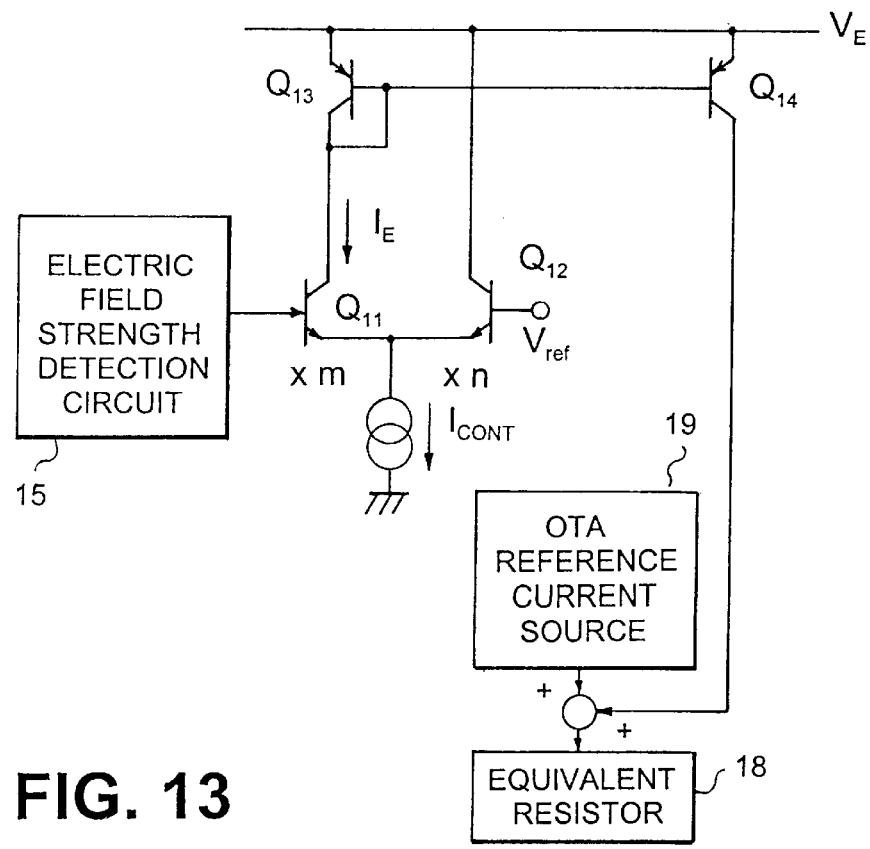
FIG. 13 is a circuit diagram showing a construction of a control current source circuit of the FM demodulation circuit shown in FIG. 11.

Referring to FIG. 13, control current source circuit 16 is formed from transistors Q11 and Q12 connected at the emitters thereof to constant current source $I_{CONT}$ so as to form a differential amplifier, OTA reference current source 19 for supplying predetermined control current IC to determine transconductance G of first OTA 18a and second OTA 18b which form equivalent resistor 18, transistor Q14 serving as a switch for adding current to output current of OTA reference current source 19, and transistor Q13 connected in series to transistor Q11 for controlling the current to flow to transistor Q14.

It is to be noted that predetermined reference voltage $V_{ref}$ is always applied to the base of transistor Q12 which is an input of transistor Q12. Meanwhile, reference symbols m and n represent emitter areas of transistors Q11 and Q12, respectively.

By the way, control current source circuit 16 shown in FIG. 13 indicates an example of a circuit of the voltage controlled type whose output current is varied by the output voltage of electric field strength detection circuit 15. Electric field strength detection circuit 15 and control current source circuit 16 need not be limited to those circuits, and electric field strength detection circuit 15 may be constructed as a circuit which outputs current corresponding to the level of input signal $f_{in}$ while control current source circuit 16 may be formed as a circuit of the current controlled type whose output current is varied by the output current of electric field strength detection circuit 15.

Figure 14:
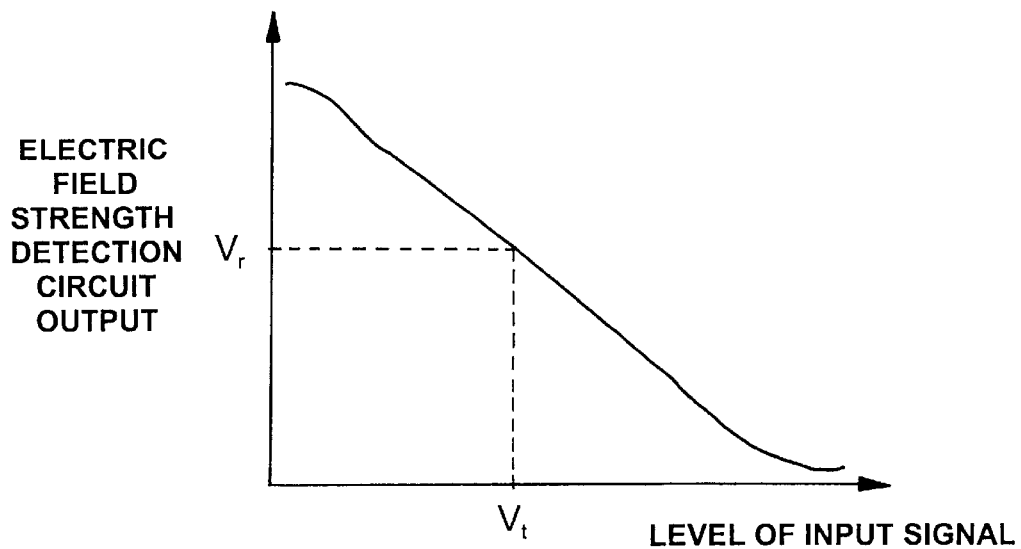
FIG. 14 is a graph illustrating an output characteristic of an electric field strength detection circuit with respect of the input signal level of the FM demodulation circuit shown in FIG. 11.

In such a construction as described above, input signal $f_{in}$ is inputted to electric field strength detection circuit 15 through amplitude limiting circuit 11, and such a voltage which increases in inverse proportion to the level of input signal $f_{in}$ as illustrated in FIG. 14 is outputted from electric field strength detection circuit 15.

Here, where the level of input signal $f_{in}$ is sufficiently high, the level of input signal $f_{in}$ is limited to the predetermined level by amplitude limiting circuit 11. This predetermined level is called threshold level $V_t$. In this instance, a voltage lower than voltage $V_r$ corresponding to threshold level $V_t$ is outputted from electric field strength detection circuit 15.

If reference voltage $V_{ref}$ of control current source circuit 16 is set higher than voltage $V_r$, then in control current source circuit 16, only transistor Q12 is turned on while transistors Q11, Q13 and Q14 are controlled to off. Consequently, output current of OTA reference current source 19 is provided as control current $I_C$ to first OTA 18a and second OTA 18b. In this instance, such a demodulation output characteristic as indicated by (1) of FIG. 15 is obtained from the FM demodulation circuit.

Figure 15:
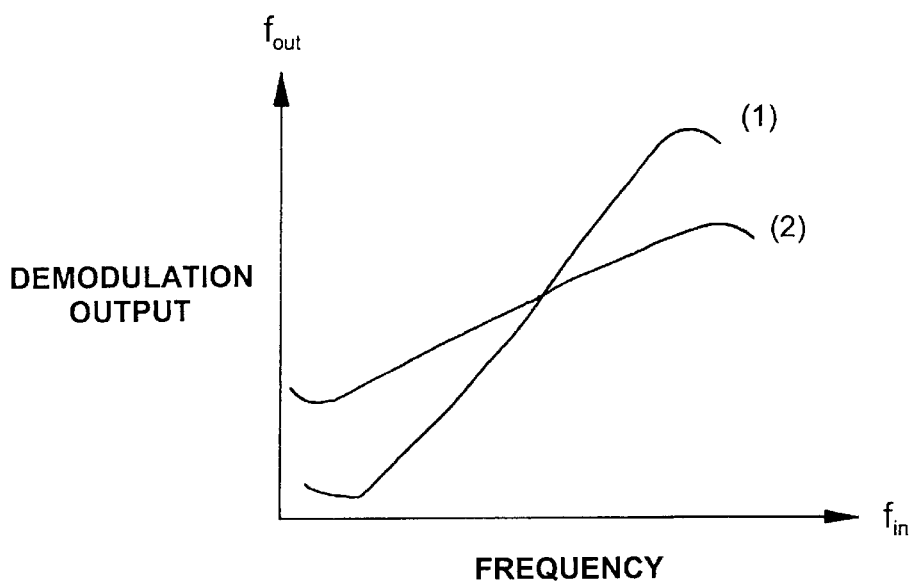
FIG. 15 is a graph illustrating a demodulation output characteristic of the FM demodulation circuit shown in FIG. 11.

On the other hand, when the level of input signal $f_{in}$ becomes lower than threshold level $V_t$, if no special control is performed as in the conventional circuit, the inclination of the demodulation output characteristic decreases as seen from (2) of FIG. 15, resulting in deterioration of the demodulation sensitivity.

In the FM demodulation circuit of the present embodiment, if the level of the input signal becomes lower than threshold level $V_t$, then a voltage higher than voltage $V_r$ is outputted from electric field strength detection circuit 15 and transistor Q12 of control current source circuit 16 is turned off while transistor Q11 is turned on and current $I_E$ flows to transistor Q13. Here, since transistors Q13 and Q14 form a current mirror circuit, current equal to the sum of current to flow through transistor Q14 and the output current of OTA reference current source 19 is supplied as control current $I_C$ to first OTA 18a and second OTA 18b (here, the mirror ratio=1).

In this instance, since control current $I_C$ to first OTA 18a and second OTA 18b exhibits an increase, impedance Rg of equivalent resistor 18 decreases and Q of resonance circuit 17 increases. Since the inclination (demodulation sensitivity) of the demodulation output characteristic illustrated in FIG. 15 is determined by Q of resonance circuit 17, the increase of Q of resonance circuit 17 raises the demodulation sensitivity.

It is to be noted that, while the foregoing described relates to a case wherein the emitter areas of transistors Q11 and Q12 which form control current source circuit 16 are equal to each other (m=n), the ratio in emitter area may be changed to an arbitrary value. In this instance, the voltage at which transistor Q11 is turned on becomes lower by $V_T \times \ln(m/n)$ than reference voltage $V_{ref}$ applied to transistor Q12. Here, $V_T$ is represented as $V_T = kT/q$, where q is charge of an electron, k the Boltzmann's constant, and T the absolute temperature.

As described above, since, when the electric field strength drops, the impedance of equivalent resistor 18 of resonance circuit 17 is varied by control current source circuit 16 and Q of resonance circuit 17 is increased, the demodulation sensitivity is raised and insufficient demodulation is prevented.

Further, since Q of resonance circuit 17 can be varied by control current $I_C$ to first OTA 18a and second OTA 18b, the demodulation sensitivity can be raised readily.

(Third Embodiment)

In the following, a third embodiment of the FM demodulation circuit of the present invention is described with reference to the drawings.

Figure 16:
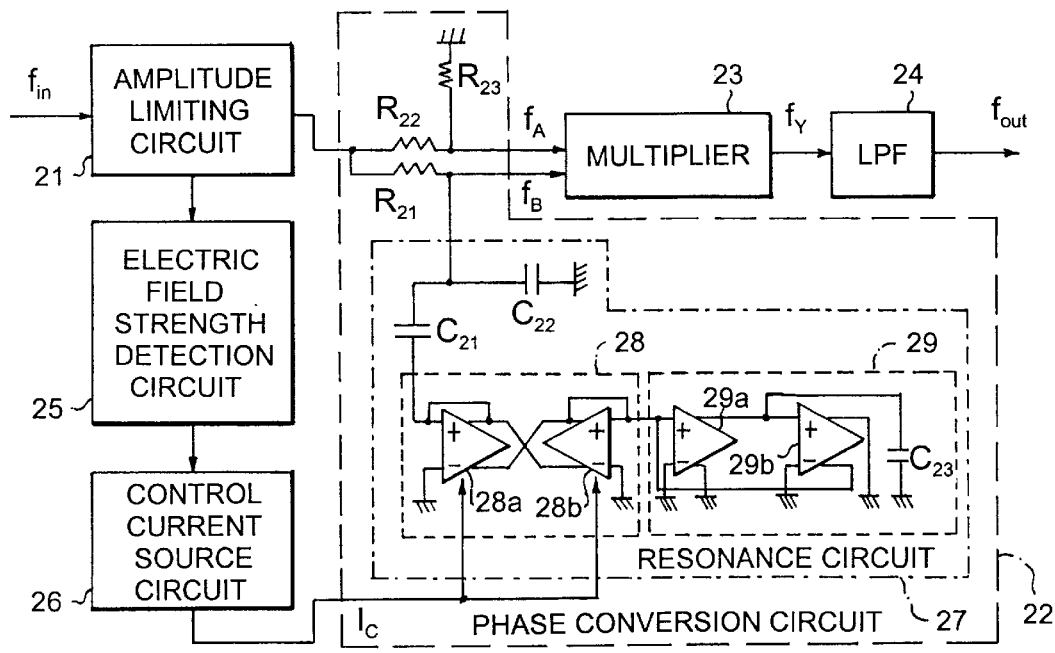
FIG. 16 is a block diagram showing a construction of a third embodiment of the FM demodulation circuit of the present invention.
Figure 17A:
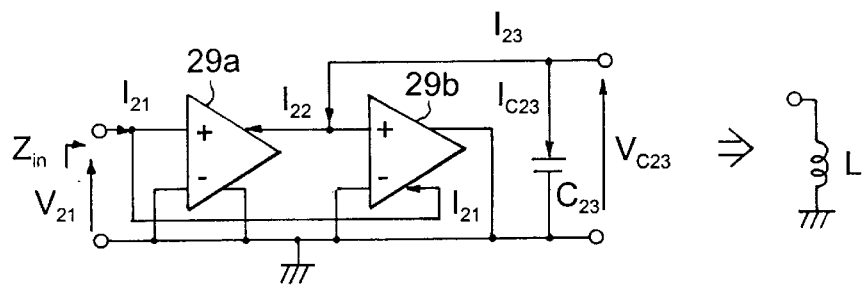
FIG. 17A is a circuit diagram showing an example of a construction of an equivalent inductance of the FM demodulation circuit shown in FIG. 16.
Figure 17B:
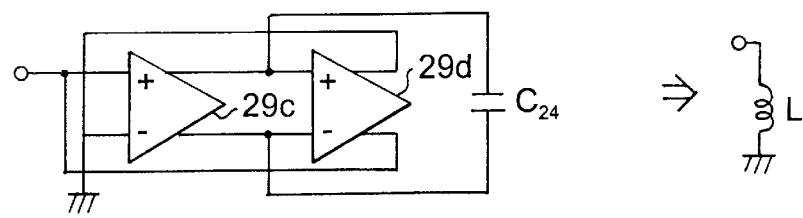
FIG. 17B is a circuit diagram showing another example of a construction of the equivalent inductance of the FM demodulation circuit shown in FIG. 16.

Referring to FIG. 16, the FM demodulation circuit of the third embodiment is different from the second embodiment in that the inductance of resonance circuit 27 is formed from third OTA 29a, fourth OTA 29b and capacitance C23 shown in FIG. 17A or from fifth OTA 29c, sixth OTA 29d and capacitance C24 shown in FIG. 17B. Since the constructions and operations of the other components of amplitude limiting circuit 21, multiplier 23, LPF 24, electric field strength detection circuit 25 and control current source circuit 26 are similar to those of the second embodiment, description thereof is omitted here.

Phase conversion circuit 22 includes resistors R21, R22 and R23, and resonance circuit 27. A bridge circuit is formed from those resistors R21 to R23 and resonance circuit 27.

Resonance circuit 27 includes capacitance C21, equivalent resistor 28 formed from first OTA 28a and second OTA 28b similarly as in the second embodiment, and equivalent inductance 29 formed from two OTAs and capacitance C23, connected in series, and capacitance C22 connected in parallel to them.

An example of equivalent inductance 29 is shown in FIG. 17A. Referring to FIG. 17A, equivalent inductance 29 is formed from, for example, third OTA 29a, fourth OTA 29b and capacitance C23.

The first output terminal of third OTA 29a is connected to the positive input terminal of fourth OTA 29b and is connected to an end of capacitance C23, and the second output terminal of fourth OTA 29b is fed back to the positive input terminal of third OTA 29a. Meanwhile, the other end of capacitance C23, the negative input terminal of third OTA 29a, the second output terminal of third OTA 29a, the negative input terminal of fourth OTA 29b and the first output terminal of fourth OTA 29b are grounded.

Meanwhile, another example of equivalent inductance 29 is shown in FIG. 17B. Referring to FIG. 17B, equivalent inductance 29 is formed from, for example, fifth OTA 29c, sixth OTA 29d and capacitance C24.

The first output terminal of fifth OTA 29c is connected the positive input terminal of sixth OTA 29d and is connected to an end of capacitance C24, and the second output terminal of fifth OTA 29c is connected to the negative input terminal of sixth OTA 29d and is connected to the other end of capacitance C24. Meanwhile, the first output terminal of sixth OTA 29d is fed back to the negative input terminal of fifth OTA 29c and is grounded, and the second output terminal of sixth OTA 29d is fed back to the positive input terminal of fifth OTA 29c.

It is to be noted that, while an equivalent inductance is described below taking the circuit shown in FIG. 17A as an example, also the circuit shown in FIG. 17B operates similarly. Accordingly, it is possible to use the circuit shown in FIG. 17B in place of the circuit shown in FIG. 17A.

Referring to FIG. 17A, where the input voltage to third OTA 29a is represented by $V_{21}$, the output voltage by $V_{C23}$, the current flowing to capacitance C23 by $I_{C23}$, the capacitance of capacitance C23 by C, and the transconductance of each OTA by G, input current $I_{21}$ to third OTA 29a and input current $I_{22}$ to fourth OTA 29b can be represented as $$I_{21} = -G \times V_{C23} \tag{9}$$

$$I_{22} = G \times V_{21} \tag{10}$$

respectively. From expression (9), $$V_{23} = I_{C23}/j\omega C \tag{11}$$

Further, $$I_{22} = -I_{C23} \tag{12}$$

Since transconductance G is a reciprocal number to impedance Rg, $$G = 1/Rg \tag{13}$$

Accordingly, from expressions (9) to (12), $$V_{21}/I_{21} = (I_{22}/G)/-G \times V_{C23}$$

$$= -1/G^2 \times (-I_{C23})/V_{C23}$$

$$= Rg^2 \times (I_{C23}/V_{C23}) \tag{13}$$

In this instance, impedance $Z_{in}$ as viewed from the input terminals of third OTA 29a is given by $$Z_{in} = j\omega C Rg^2 \tag{14}$$

Further, since $Z_{in}$ can be represented also by $j\omega L$, $$L = Rg^2 C \tag{15}$$

Accordingly, equivalent inductance 29 shown in FIG. 17A is equivalent to inductance L whose one end is grounded.

Consequently, resonance circuit 27 shown in FIG. 16 is equivalent to a series resonance circuit formed from capacitance C21, a resistor and inductance L.

It is to be noted that impedance Rg of equivalent resistor 28 can be varied by control current $I_C$ outputted from control current source circuit 26 similarly as in the second embodiment.

Accordingly, also with the FM demodulation circuit of the present embodiment, since, when the electric field strength drops, impedance Rg of equivalent resistor 28 is varied and Q of resonance circuit 27 is increased similarly as in the second embodiment, the demodulation sensitivity is raised and insufficient demodulation is prevented.

Further, since inductance L of resonance circuit 27 is formed from two OTAs and one capacitance, all circuits which form the FM demodulation circuit can be integrated into a single device.

(Fourth Embodiment)

In the following, a fourth embodiment of the FM demodulation circuit of the present invention is described with reference to the drawings.

Figure 18:
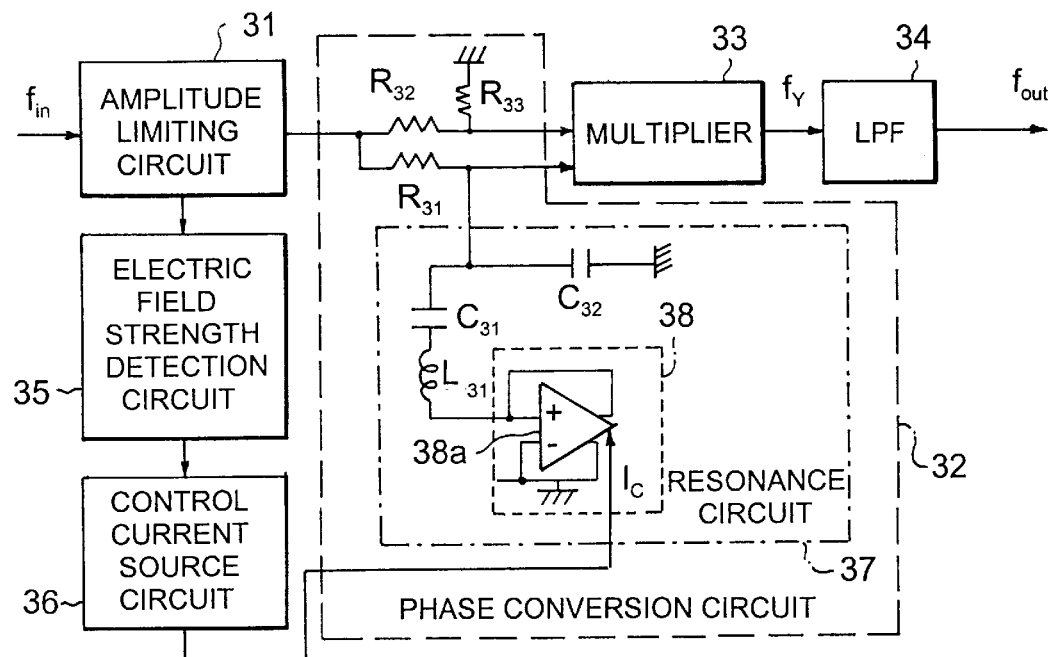
FIG. 18 is a block diagram showing a construction of a fourth embodiment of the FM demodulation circuit of the present invention.

Referring to FIG. 18, the FM demodulation circuit of the fourth embodiment is different from the second embodiment in construction of resonance circuit 37 provided in phase conversion circuit 32. Since the constructions and operations of the other components of amplitude limiting circuit 31, multiplier 33, LPF 34, electric field strength detection circuit 35 and control current source circuit 36 are similar to those in the second embodiment, description thereof is omitted here.

Phase conversion circuit 32 includes resistors R31, R32 and R33, and resonance circuit 37. A bridge circuit is formed from those resistors R31 to R33 and resonance circuit 37.

Resonance circuit 37 is formed from capacitance C31, inductance L31, equivalent resistor 38 formed from a single OTA, connected in series, and capacitance C32 connected in parallel to those elements.

Referring to FIG. 18, the first output terminal of OTA 38a which forms equivalent resistor 38 is fed back to the positive input terminal, and the negative input terminal and the second output terminal are grounded.

Here, where the input current to OTA 38a is represented by I31, the input voltage by V31 and the transconductance by G, $$G = I_{31}/V_{31} \tag{7}$$

Where transconductance G is represented using impedance Rg, $$Rg = V_{31}/I_{31} \tag{8}$$

Figure 19:
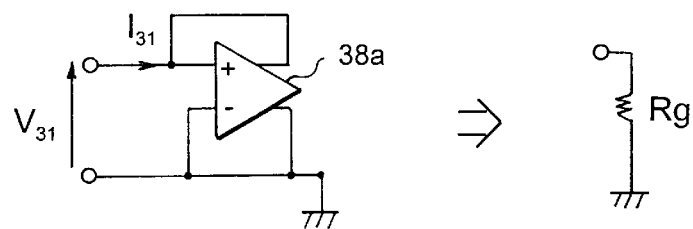
FIG. 19 is a circuit diagram showing a construction of an equivalent resistor of the FM demodulation circuit shown in FIG. 18.

Accordingly, equivalent resistor 38 shown in FIG. 19 is equivalent to a resistor which has impedance Rg and is grounded at one end thereof.

Consequently, since, also with the FM demodulation circuit of the present embodiment, when the electric field strength drops, impedance Rg of equivalent resistor 38 is varied and Q of resonance circuit 37 is increased similarly as in the second embodiment, the demodulation sensitivity is raised and insufficient demodulation is prevented.

Figure 20:
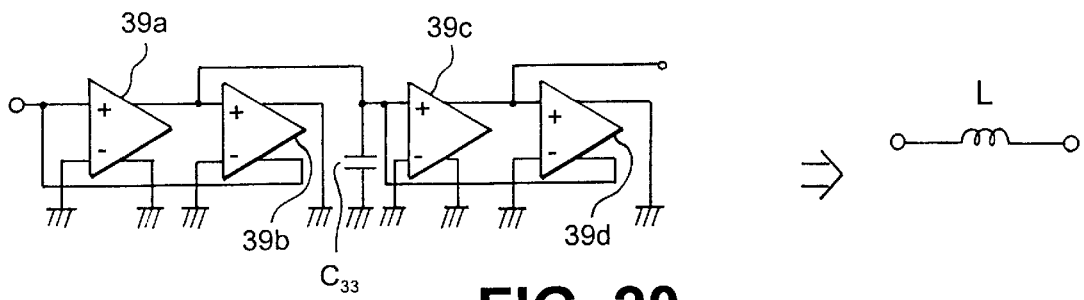
FIG. 20 is a circuit diagram showing an example of an equivalent inductance which operates similarly to the inductance shown in FIG. 18.

It is to be noted that inductance L31 can be replaced by an equivalent inductance formed from such first OTA 39a, second OTA 39b, third OTA 39c, fourth OTA 39d and capacitance C33 as shown in FIG. 20. By such replacement, all circuits which form the FM demodulator can be integrated into a single device similarly as in the third embodiment.

(Fifth Embodiment)

In the following, a fifth embodiment of the FM demodulation circuit of the present invention is described with reference to the drawings.

Figure 21:
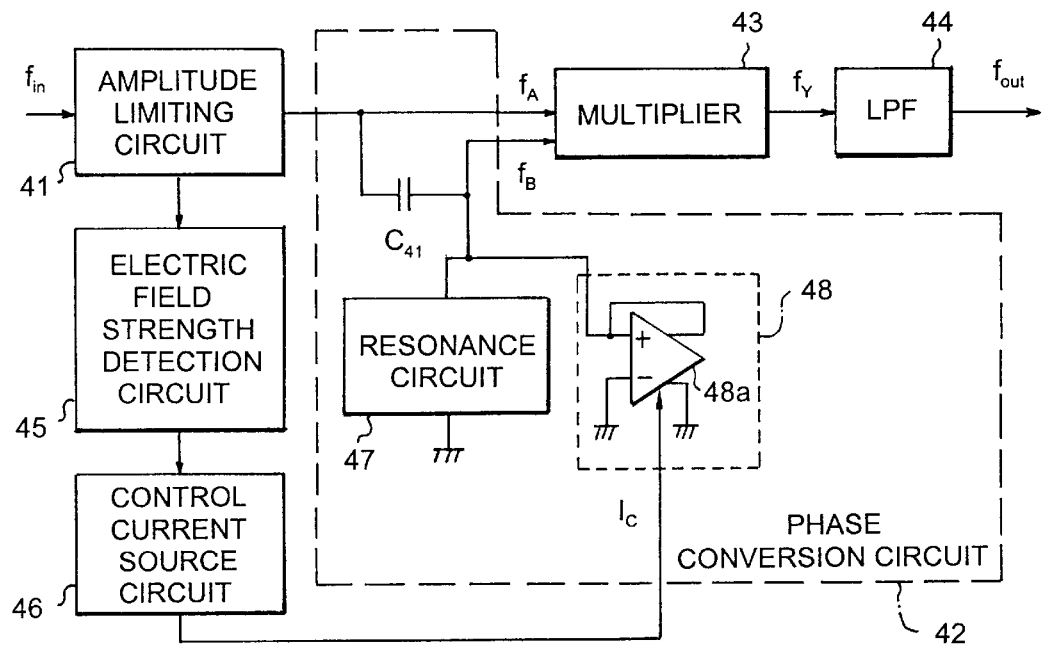
FIG. 21 is a block diagram showing a construction of a fifth embodiment of the FM demodulation circuit of the present invention.

Referring to FIG. 21, the FM demodulation circuit of the fifth embodiment is improvement in or relating to a quadrature detection circuit which makes use of a frequency to phase characteristic of a resonance circuit described hereinabove in connection with the conventional circuit. Further, as the resistor connected in parallel to resonance circuit 47, equivalent resistor 48 similar to that of the fourth embodiment is used. Since the constructions and operations of amplitude limiting circuit 41, multiplier 43, LPF 44 and electric field strength detection circuit 45 are similar to those in the second embodiment, description thereof is omitted here.

Phase conversion circuit 42 is composed of resonance circuit 47, equivalent resistor 48 connected in parallel to resonance circuit 47, and capacitance C41 connected in series to resonance circuit 47 and equivalent resistor 48 and inserted in a line along which signal $f_B$ is transmitted. Resonance circuit 47 is formed from a well known LC resonance circuit, ceramic discriminator or like element.

Meanwhile, equivalent resistor 48 is equivalent to a resistor which is grounded at one end thereof as described hereinabove in connection with the fourth embodiment.

Figure 1:
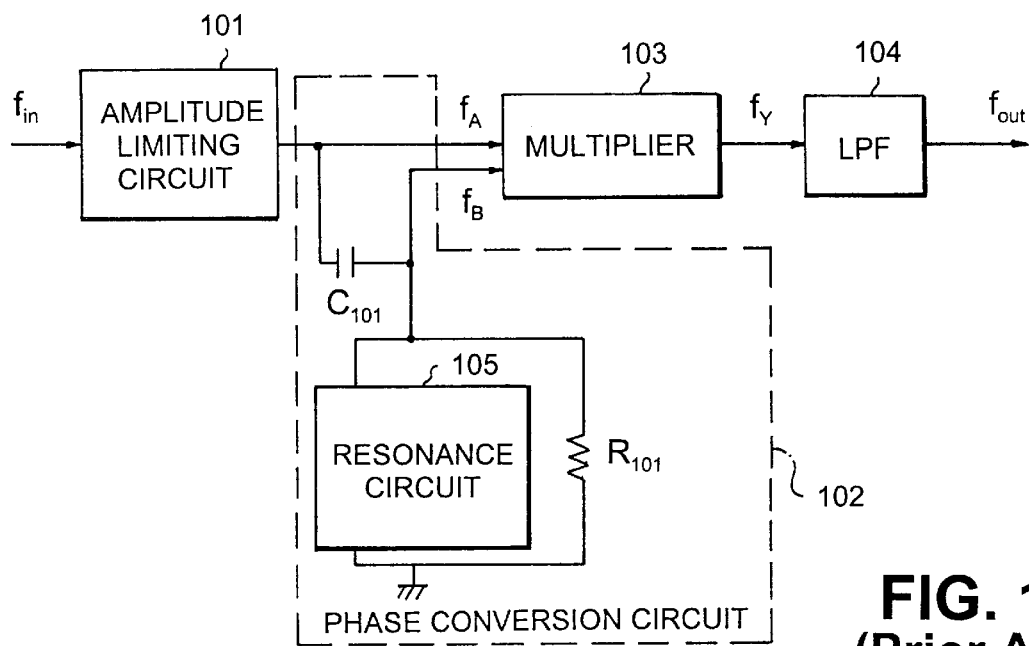
FIG. 1 is a block diagram showing a construction of a conventional quadrature detection circuit which makes use of a frequency to phase characteristic of a resonance circuit of an FM demodulation circuit.
Figure 2A:
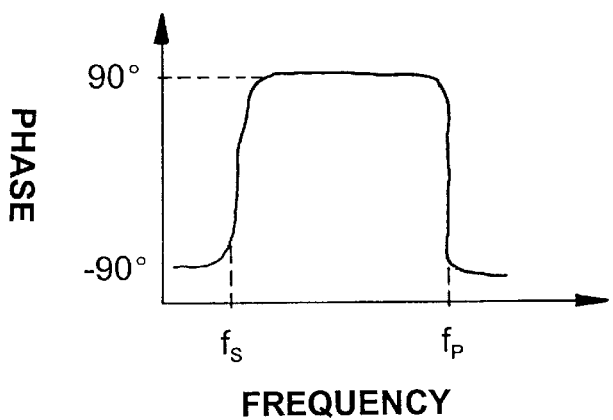
FIG. 2A is a view illustrating a frequency to phase characteristic of a phase conversion circuit of the FM demodulation circuit shown in FIG. 1 and is a graph illustrating a characteristic of a resonance circuit itself.
Figure 2B:
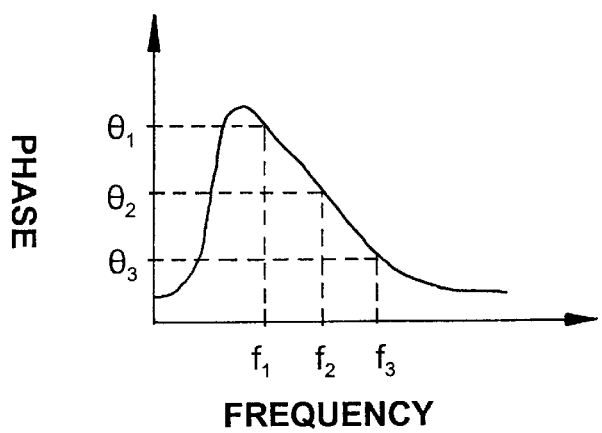
FIG. 2B is a view showing another frequency to phase characteristic of the phase conversion circuit of the FM demodulation circuit shown in FIG. 1 and is a graph illustrating a characteristic of the resonance circuit to which a resistor is connected in parallel.
Figure 3:
FIG. 3 is a circuit diagram showing a construction of a multiplier of the FM demodulation circuit shown in FIG. 1.
Figure 4:
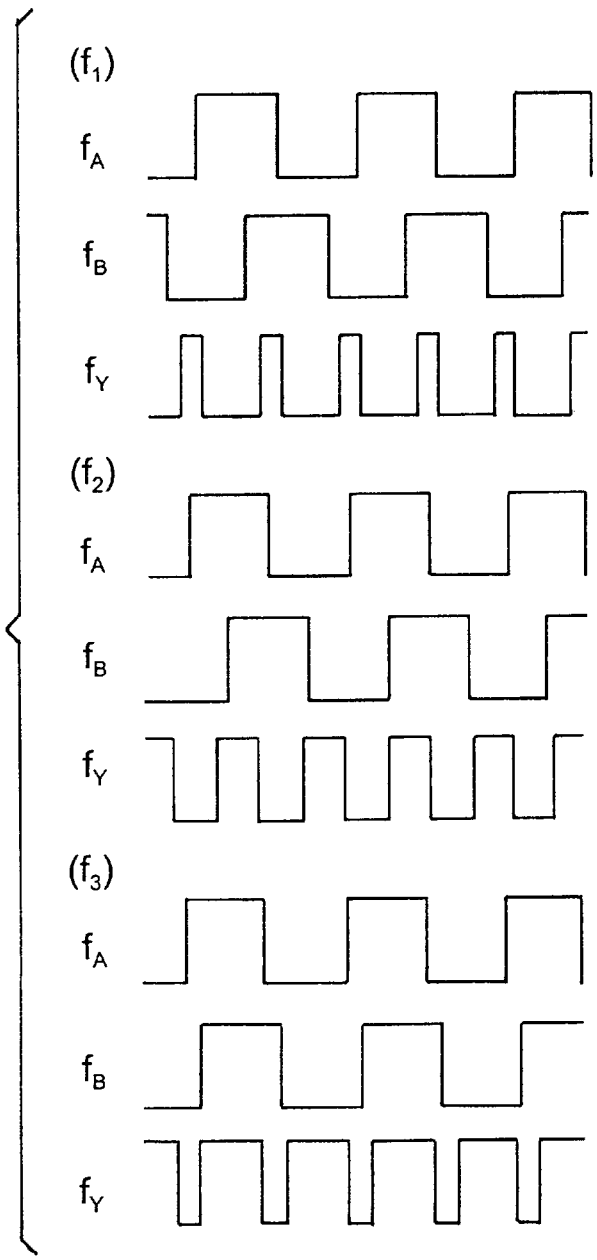
FIG. 4 is a timing chart illustrating different manners of input and output waveforms of the multiplier of the FM demodulation circuit shown in FIG. 1.
Figure 5:
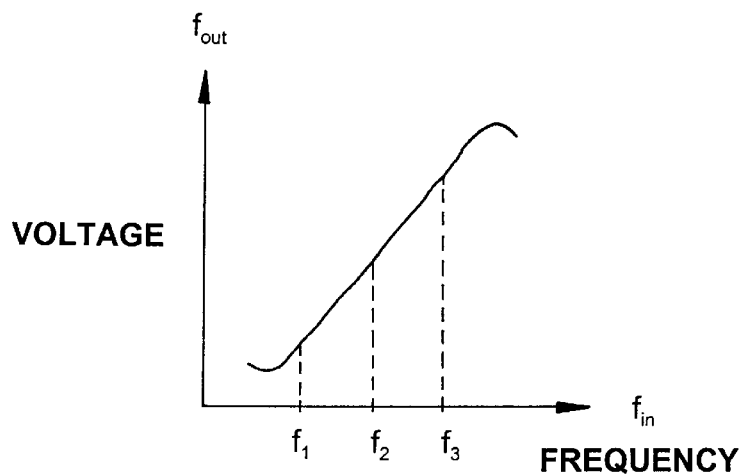
FIG. 5 is a graph illustrating a demodulation output characteristic of the FM demodulation circuit shown in FIG. 1.
Figure 6:
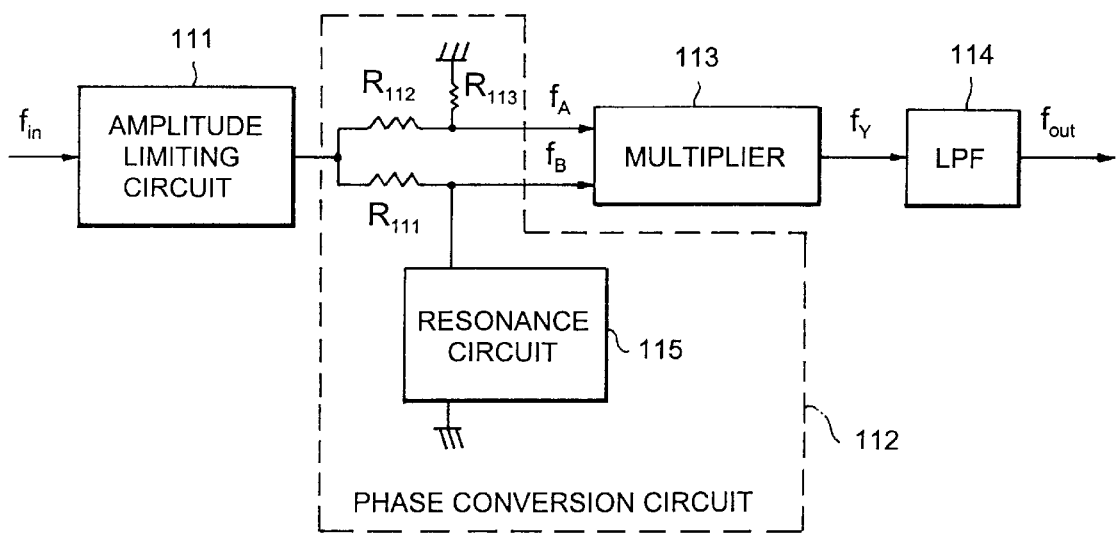
FIG. 6 is a block diagram showing a construction of a conventional quadrature detection circuit which makes use of a frequency to impedance characteristic of a resonance circuit of an FM demodulation circuit.
Figure 7:
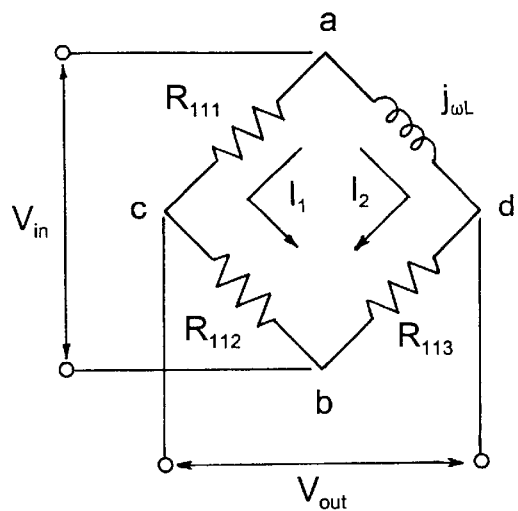
FIG. 7 is an equivalent circuit diagram of a phase conversion circuit of the FM demodulation circuit shown in FIG. 6.
Figure 8:
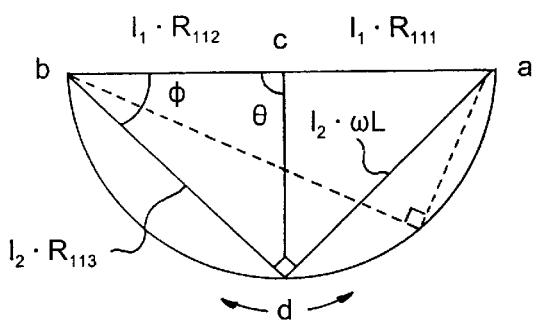
FIG. 8 is a vector diagram illustrating an input-output voltage characteristic of the phase conversion circuit of the FM demodulation circuit shown in FIG. 6.
Figure 9:
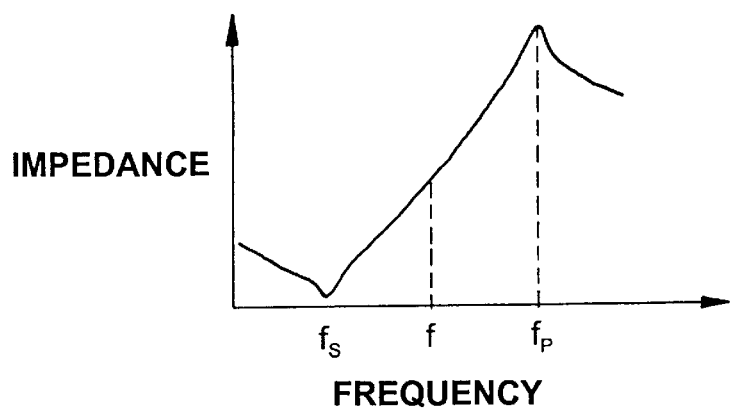
FIG. 9 is a graph illustrating a frequency to impedance characteristic of a resonance circuit of the FM demodulation circuit shown in FIG. 6.

Here, resonance circuit 47 has a frequency to phase characteristic similar to the characteristic illustrated in FIG. 2A, and the frequency to phase characteristic illustrated in FIG. 2B can be obtained by connecting equivalent resistor 48 in parallel to resonance circuit 47. Since the principle of operation of a quadrature detection circuit which makes use of this frequency to phase characteristic is described hereinabove in connection with the prior art, description thereof is omitted here.

Figure 22:
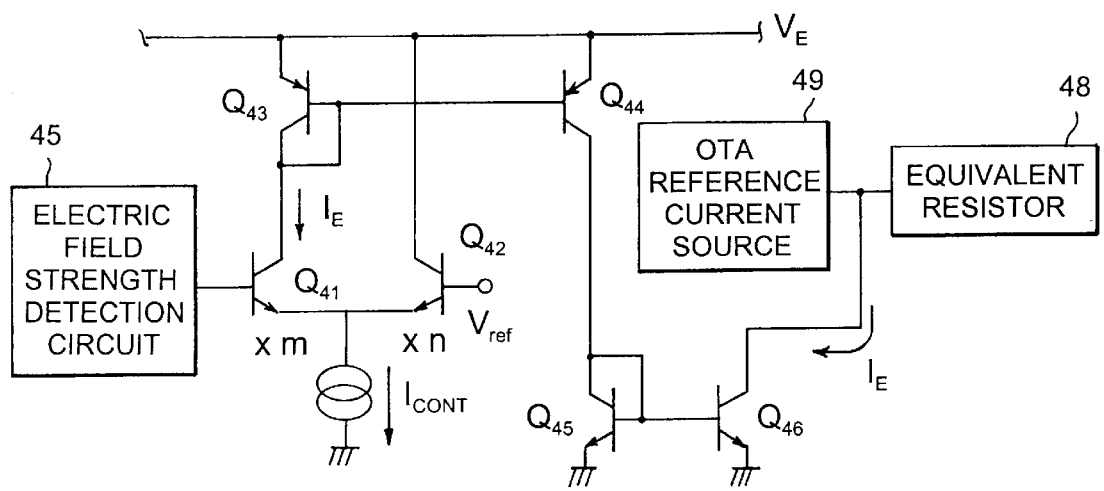
FIG. 22 is a circuit diagram showing a construction of a control current source circuit of the FM demodulation circuit shown in FIG. 21.

Referring to FIG. 22, control current source circuit 46 in the present embodiment is formed from transistors Q41 and Q42 connected at the emitters thereof to constant current source ICONT so as to form a differential amplifier, OTA reference current source 49 for outputting predetermined control current IC to determine transconductance G of OTA 48a which forms equivalent resistor 48, transistor Q46 serving as a switch for shunting output current of OTA reference current source 49, transistor Q45 cooperating with transistor Q46 to form a current mirror circuit for controlling current to flow to transistor Q46, transistor Q44 for flowing current through transistor Q45, and transistor Q43 connected in series to transistor Q41 for controlling current to flow through transistor Q44.

It is to be noted that predetermined reference voltage $V_{ref}$ is always applied to the base of transistor Q42 which serves as an input of transistor Q42.

In such a construction as described above, when the level of frequency modulated input signal $f_{in}$ is higher than threshold level $V_t$, similarly as in the control current source circuit shown in FIG. 13, only transistor Q42 is turned on, and control current $I_C$ is supplied from OTA reference current source 49 to OTA 48a which forms equivalent resistor 48. Consequently, the FM demodulation circuit operates with a predetermined demodulation output characteristic.

On the other hand, when the level of input signal $f_{in}$ is lower than threshold level $V_t$, the output voltage of electric field strength detection circuit 45 is higher than reference voltage $V_{ref}$ of control current source circuit 46, and transistor Q41 is turned on so that current $I_E$ flows through transistor Q43. Thereupon, since transistors Q43 and Q44, and transistors Q45 and Q46 form current mirror circuits, current $I_E$ flows to transistor Q46.

Since output current of OTA reference current source 49 is shunted to OTA 48a and transistor Q46, control current $I_C$ to be supplied to OTA 48a decreases. As control current $I_C$ to OTA 48a decreases, the resistance value of equivalent resistor 48 increases and the inclination of the frequency to phase characteristic of resonance circuit 47 increases. Accordingly, the demodulation sensitivity is raised.

Consequently, also with the FM demodulation circuit of the present embodiment, when the electric field strength decreases, the resistance value of equivalent resistor 48 is varied by control current source circuit 46 so that the demodulation sensitivity is increased and insufficient demodulation is prevented.

(Sixth Embodiment)

In the following, a sixth embodiment of the FM demodulation circuit of the present invention is described with reference to the drawings.

Figure 23:
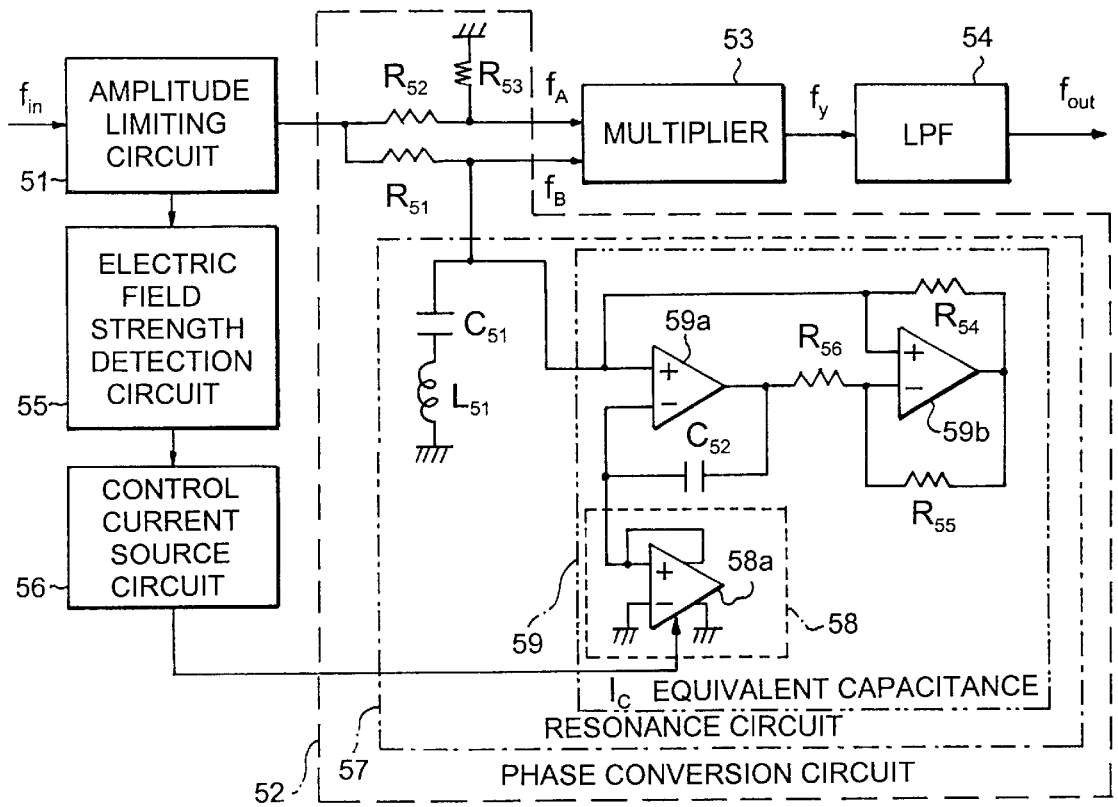
FIG. 23 is a block diagram showing a construction of a sixth embodiment of the FM demodulation circuit of the present invention.

Referring to FIG. 23, the FM demodulation circuit of the sixth embodiment is different from the second embodiment in construction of resonance circuit 57 which forms phase conversion circuit 52. Since the constructions and operations of the other components of amplitude limiting circuit 51, multiplier 53, LPF 54, electric field strength detection circuit 55 and control current source circuit 56 are similar to those in the second embodiment, description thereof is omitted here.

Phase conversion circuit 52 includes resistors R51, R52 and R53, and resonance circuit 57. A bridge circuit is formed from resistors R51 to R53 and resonance circuit 57.

Resonance circuit 57 is formed from capacitance C51 and inductance L51 connected in series, and equivalent capacitance 59 connected in parallel to them.

Equivalent capacitance 59 is formed from first operational amplifier 59a, second operational amplifier 59b and equivalent resistor 58 which is similar to that in the fourth embodiment. The output terminal of first operational amplifier 59a is fed back to the negative input terminal through capacitance C52 and is connected to the negative input terminal of second operational amplifier 59b through resistor R56. Meanwhile, the output terminal of second operational amplifier 59b is fed back to the negative input terminal through resistor R55 and is fed back to the positive input terminal of second operational amplifier 59b and the positive input terminal of first operational amplifier 59a through resistor R54.

Further, the negative input terminal of first operational amplifier 59a is connected to the positive input terminal of OTA 58a which forms equivalent resistor 58.

In such a construction as described above, if, as shown in FIG. 24, resistors R54 to R56 are replaced by impedances Z1 to Z3, capacitance C52 by impedance Z4, and equivalent resistor 58 by impedance Z5 and the input voltage to first operational amplifier 59a is represented by $V_{51}$, the output voltage of first operational amplifier 59a by $V_{52}$ and the output voltage of second operational amplifier 59b by $V_{53}$, the following expressions stand:

$$(V_{52}-V_{51})/Z4=V_{51}/Z5 \quad (16)$$

$$(V_{52}-V_{51})/Z3=(V_{51}-V_{53})/Z2 \quad (17)$$

Meanwhile, input current $I_{51}$ to first operational amplifier 59a is given by $$I_{51}=(V_{51}-V_{53})/Z1 \quad (18)$$

Accordingly, by arranging expressions (16) to (18), impedance $Z_{in}$ as viewed from the input terminal of first operational amplifier 59a is represented by $$Z_{in}=V_{51}/I_{51}=(Z1 \times Z3 \times Z5)/(Z2 \times Z4) \quad (19)$$

Here, by replacing impedances Z1 to Z3 by resistor R50, impedance Z4 by impedance jωC52 and impedance Z5 by impedance Rg, input impedance $Z_{in}$ of equivalent capacitance 59 is given by $$Z_{in}=3R50/j\omega C52 \times Rg=k \times 1/j \times C52 \quad (20)$$

Figure 24:
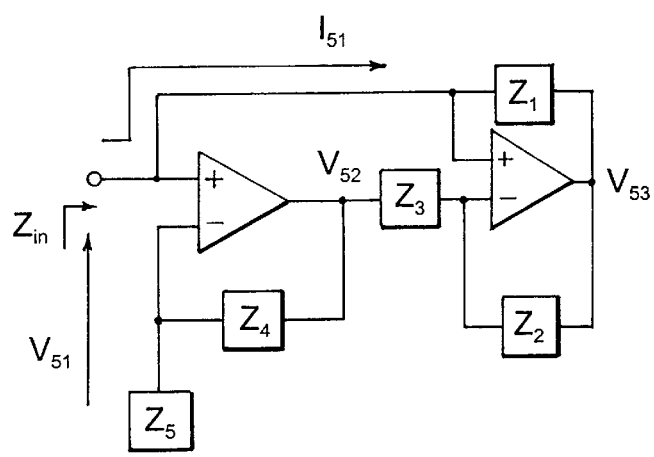
FIG. 24 is a block diagram showing a construction of an equivalent capacitance of the FM demodulation circuit shown in FIG. 23.

Accordingly, equivalent capacitance 59 shown in FIG. 24 is equivalent to capacitance C53 whose one end is grounded. It is to be noted that k in expression (20) is a proportional constant (k=3R50/Rg).

Figure 25:
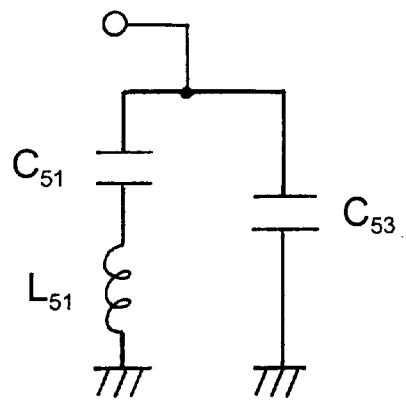
FIG. 25 is an equivalent circuit diagram of a resonance circuit of the FM demodulation circuit shown in FIG. 23.

Consequently, resonance circuit 57 shown in FIG. 23 is equivalent to an LC resonance circuit shown in FIG. 25.

Series resonance frequency $f_s$ and parallel resonance frequency $f_p$ of this LC resonance circuit are represented by $$f_s=\tfrac{1}{2}\pi(L51 \times C51)^{1/2} \quad (21)$$

$$f_p=\tfrac{1}{2}\pi(L51 \times C51)^{1/2} \times (1+C51/C53)^{1/2}$$

$$=f_s \times (1+C51/C53)^{1/2} \quad (22)$$

As can be seen from expressions (21) and (22), since the values of capacitance C51 and inductance L51 serve as parameters of both of series resonance frequency $f_s$ and parallel resonance frequency $f_p$, even if those values are varied, the values of series resonance frequency $f_s$ and parallel resonance frequency $f_p$ merely move parallelly with respect to the frequency axis. However, if only the value of capacitance C53 is varied, then only parallel resonance frequency $f_p$ is varied as seen from FIG. 26.

Figure 26:
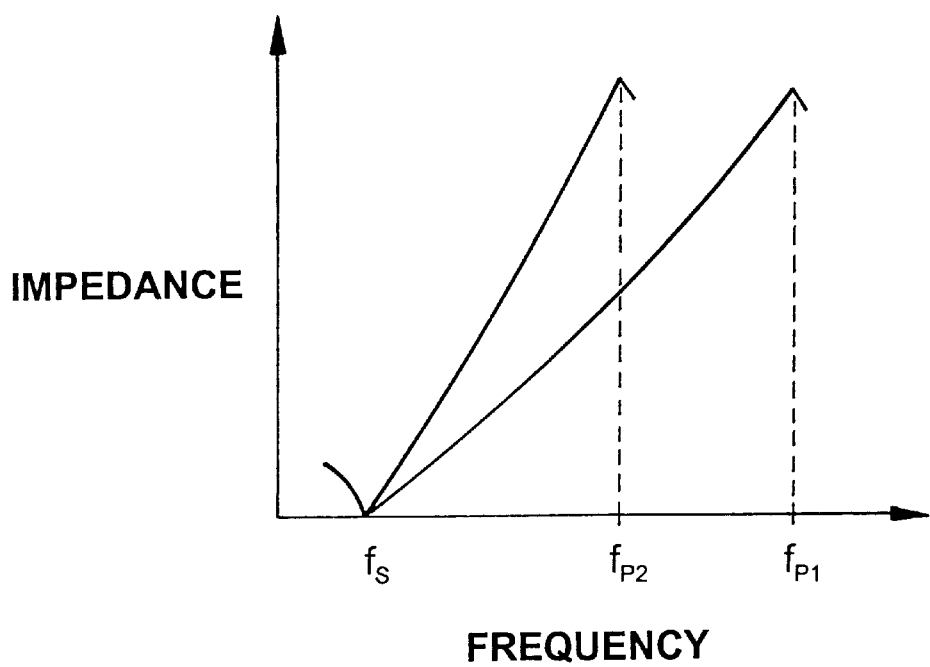
FIG. 26 is a graph illustrating a frequency to impedance characteristic of the resonance circuit of the FM demodulation circuit shown in FIG. 23 and illustrating a manner when the parallel resonance frequency varies.

As seen from FIG. 26, since the frequency to impedance characteristic having low parallel resonance frequency $f_{p2}$ exhibits a larger variation in impedance with respect to a variation in frequency (has a high Q value), it raises the demodulation sensitivity comparing with the frequency to impedance characteristic having high parallel resonance frequency $f_{p1}$.

By the way, control current source circuit 56 is preferably formed from a circuit similar to that employed in the fifth embodiment. In this instance, when the level of input signal $f_{in}$ drops, control current $I_C$ which is decreased comparing with that when the level of input signal $f_{in}$ is higher is supplied to OTA 58a.

As control current $I_C$ to OTA 58a decreases, the resistance value of resonance circuit 58 increases and the value of impedance Z5 of equivalent capacitance 59 shown in FIG. 24 increases.

Since the value of equivalent capacitance 59 decreases as Rg increases as seen from expression (20), parallel resonance frequency $f_p$ decreases as seen from expression (22).

Accordingly, the inclination of the frequency to impedance characteristic increases and the demodulation sensitivity rises.

Consequently, also with the FM demodulation circuit of the present embodiment, when the electric field strength drops, parallel resonance frequency $f_p$ decreases and Q of resonance circuit 57 increases to raise the demodulation sensitivity. Consequently, insufficient demodulation is prevented.

It is to be noted that, while, in the present embodiment, an equivalent resistor is used as impedance Z5 and a capacitance is used as impedance Z4, impedance Zi or impedance Z3 may be formed from an equivalent resistor similar to that in the second embodiment, and a capacitance may be used as impedance Z2. Also where those circuits are employed, similar operation to that of the present embodiment is achieved.

Further, inductance L51 may be replaced by the equivalent inductance shown in FIG. 17A or 17B. In this instance, all circuits which form the FM demodulation circuit can be integrated into a single device similarly as in the third embodiment.

It is to be noted that, while the embodiments described above are described such that each OTA has two input terminals of the negative input terminal and the positive input terminal to which differential inputs are inputted, the number of input terminals is not limited to 2 but may be 3 or more. In this instance, those input terminals which are not used should be grounded.

What is claimed is:

1. An FM demodulation circuit wherein a demodulation sensitivity thereof is raised when a level of a frequency modulated input signal drops, comprising:

a phase conversion circuit for outputting a first output signal having the same phase as that of the input signal and a second output signal obtained by converting a frequency variation of the input signal into a phase variation, said phase conversion circuit allowing variation of a characteristic of the phase variation with respect to the frequency variation;

a multiplier for outputting a signal of a phase difference between the first output signal and the second output signal outputted from said phase conversion circuit;

a low-pass filter for integrating the output signal of said multiplier to form a demodulation signal and outputting the demodulation signal;

an electric field strength detection circuit for detecting a level of the input signal; and a control current source circuit for outputting, when the level of the input signal detected by said electric field strength detection circuit drops lower than a predetermined level, control current to vary the characteristic of the phase variation with respect to the frequency variation to raise the demodulation sensitivity.

2. An FM demodulation circuit as claimed in claim 1, wherein said phase conversion circuit includes three resistors, and a resonance circuit having a series resonance frequency and a parallel resonance frequency in a frequency characteristic thereof and cooperating with said three resistors to form a bridge circuit.

3. An FM demodulation circuit as claimed in claim 2, wherein said resonance circuit includes a first capacitance, an inductance, an equivalent resistor including a first transconductance amplifier and a second transconductance amplifier each of which has a first input terminal and a second input terminal to which differential inputs are inputted, and a first output terminal and a second output terminal which outputs an inverted output to that of said first output terminal, and has a transconductance which can be varied by the control current, said first output terminal of said first transconductance amplifier being fed back to said first input terminal and connected to said second output terminal of said second transconductance amplifier, said first output terminal of said second transconductance amplifier being fed back to said first input terminal and connected to said second output terminal of said first transconductance amplifier, the other input terminals of said first transconductance amplifier and said second transconductance amplifier being grounded, and a second capacitance connected in parallel to said first capacitance, said equivalent resistor and said inductance which are connected in series.

4. An FM demodulation circuit as claimed in claim 3, wherein said inductance is an equivalent inductance which includes a third transconductance amplifier and a fourth transconductance amplifier each of which has a first input terminal and a second input terminal to which differential inputs are inputted, and a first output terminal and a second output terminal which outputs an inverted output to that of said first output terminal, and a third capacitance, said first out put terminal of said third transconductance amplifier being connected to said first input terminal of said fourth transconductance amplifier and an end of said third capacitance, said second output terminal of said fourth transconductance amplifier being fed back to said first input terminal of said third transconductance amplifier, the other input terminals and the other output terminals of said third transconductance amplifier and said fourth transconductance amplifier and the other end of said third capacitance being grounded.

5. An FM demodulation circuit as claimed in claim 3, wherein said inductance is an equivalent inductance which includes a third transconductance amplifier and a fourth transconductance amplifier each of which has a first input terminal and a second input terminal to which differential inputs are inputted, and a first output terminal and a second output terminal which outputs an inverted output to that of said first output terminal, and a third capacitance, said first output terminal of said third transconductance amplifier being connected to said first input terminal of said fourth transconductance amplifier and also to an end of said third capacitance, said second output terminal of said third transconductance amplifier being connected to said second input terminal of said fourth transconductance amplifier and also to the other end of said third capacitance, said first output terminal of said fourth transconductance amplifier being fed back to said second input terminal of said third transconductance amplifier and grounded, said second output terminal of said fourth transconductance amplifier being fed back to said first input terminal of said third transconductance amplifier, the other input terminals and the other output terminals of said third conductance amplifier and said fourth transconductance amplifier being grounded.

6. An FM demodulation circuit as claimed in claim 2, wherein said resonance circuit includes a first capacitance, an inductance, an equivalent resistor including a first transconductance amplifier which has a first input terminal and a second input terminal to which differential inputs are inputted, and a first output terminal and a second output terminal which outputs an inverted output to that of said first output terminal, and has a transconductance which can be changed by the control current, said first output terminal of said first transconductance amplifier being fed back to said first input terminal, the other input terminal and the other output terminal of said first transconductance amplifier being grounded, and a second capacitance connected in parallel to said first capacitance, said inductance and said equivalent resistor which are connected in series.

7. An FM demodulation circuit as claimed in claim 6, wherein said inductance is an equivalent inductance which includes a second transconductance amplifier, a third transconductance amplifier, a fourth transconductance amplifier and a fifth transconductance amplifier each of which has a first input terminal and a second input terminal to which differential inputs are inputted, and a first output terminal and a second output terminal which outputs an inverted output to that of said first output terminal, and a third capacitance, said first output terminal of said second transconductance amplifier being connected to said first input terminal of said third transconductance amplifier and an end of said third capacitance as well as said first input terminal of said fourth transconductance amplifier, said second output terminal of said third transconductance amplifier being fed back to said first input terminal of said second transconductance amplifier, said first output terminal of said fourth transconductance amplifier being connected to said first input terminal of said fifth transconductance amplifier, said second output terminal of said fifth transconductance amplifier being fed back to said first input terminal of said fourth transconductance amplifier, the other input terminals and the other output terminals of said second transconductance amplifier, said third transconductance amplifier, said fourth transconductance amplifier and said fifth transconductance amplifier and the other end of said third capacitance being grounded.

8. An FM demodulation circuit as claimed in claim 2, wherein said resonance circuit includes a first capacitance, an inductance, and an equivalent capacitance including a first operational amplifier and a second operational amplifier, and a first transconductance amplifier which has a first input terminal and a second input terminal to which differential inputs are inputted, and a first output terminal and a second output terminal which outputs an inverted output to that of said first output terminal, and has a transconductance which can be changed by the control current, an output of said first operational amplifier being fed back to a negative input terminal through said first capacitance and connected to a negative input terminal of said second operational amplifier through a first resistor, an output terminal of said second operational amplifier being fed back to said negative input terminal through a second resistor and fed back to a positive input terminal of said second operational amplifier and a positive input terminal of said first amplifier through a third resistor, said first output terminal of said first transconductance amplifier being fed back to said first input terminal and connected to said negative input terminal of said first operational amplifier, the other input terminal and the other output terminal of said first transconductance amplifier being grounded, said equivalent capacitance being connected in parallel to said first capacitance and said inductance which are connected in series.

9. An FM demodulation circuit as claimed in claim 8, wherein said inductance is an equivalent inductance which includes a second transconductance amplifier and a third transconductance amplifier each of which has a first input terminal and a second input terminal to which differential inputs are inputted, and a first output terminal and a second output terminal which outputs an inverted output to that of said first output terminal, and a second capacitance, said first output terminal of said second transconductance amplifier being connected to said first input terminal of said third transconductance amplifier and also to an end of said second capacitance, said second output terminal of said third transconductance amplifier being fed back to said first input terminal of said second transconductance amplifier, the other input terminals and the other output terminals of said second conductance amplifier and said third transconductance amplifier and the other end of said second capacitance being grounded.

10. An FM demodulation circuit as claimed in claim 8, wherein said resonance circuit is an equivalent inductance which includes a second transconductance amplifier and a third transconductance amplifier each of which has a first input terminal and a second input terminal to which differential inputs are inputted, and a first output terminal and a second output terminal which outputs an inverted output to that of said first output terminal, and a second capacitance, said first output terminal of said second transconductance amplifier being connected to said first input terminal of said third transconductance amplifier and also to an end of said second capacitance, said second output terminal of said second transconductance amplifier being connected to said second input terminal of said third transconductance amplifier and also to the other end of said second capacitance, said first output terminal of said third transconductance amplifier being fed back to said second input terminal of said second transconductance amplifier and grounded, said second output terminal of said third transconductance amplifier being fed back to said first input terminal of said second transconductance amplifier, the other input terminals and the other output terminals of said second conductance amplifier and said third transconductance amplifier being grounded.

11. An FM demodulation circuit as claimed in claim 1, wherein said phase conversion circuit includes a resonance circuit having a series resonance frequency and a parallel resonance frequency in a frequency characteristic thereof, an equivalent resistor including a transconductance amplifier which has a first input terminal and a second input terminal to which differential inputs are inputted, and a first output terminal and a second output terminal which outputs an inverted output to that of said first output terminal, and has a transconductance which can be changed by the control current, said first output terminal of said transconductance amplifier being fed back to said first input terminal, the other input terminal and the other output terminal of said transconductance amplifier being grounded, said equivalent resistor being connected in parallel to said resonance circuit, and a capacitance connected in series to said resonance circuit and said equivalent resistor and inserted in series in a line along which the second output signal is transmitted.

12. An FM demodulation circuit as claimed in claim 3, wherein said electric field strength detection circuit outputs a voltage which increases in inverse proportion to the level of the input signal, and said control current source circuit includes a differential amplifier including a first transistor and a second transistor which receives at an input thereof a predetermined reference voltage, an OTA reference current source for outputting predetermined control current, a third transistor for adding predetermined current to the output current of said OTA reference current source, and a fourth transistor connected in series to said first transistor for controlling current to flow through said third transistor.

13. An FM demodulation circuit as claimed in claim 4, wherein said electric field strength detection circuit outputs a voltage which increases in inverse proportion to the level of the input signal, and said control current source circuit includes a differential amplifier including a first transistor and a second transistor which receives at an input thereof a predetermined reference voltage, an OTA reference current source for outputting predetermined control current, a third transistor for adding predetermined current to the output current of said OTA reference current source, and a fourth transistor connected in series to said first transistor for controlling current to flow through said third transistor.

14. An FM demodulation circuit as claimed in claim 5, wherein said electric field strength detection circuit outputs a voltage which increases in inverse proportion to the level of the input signal, and said control current source circuit includes a differential amplifier including a first transistor and a second transistor which receives at an input thereof a predetermined reference voltage, an OTA reference current source for outputting predetermined control current, a third transistor for adding predetermined current to the output current of said OTA reference current source, and a fourth transistor connected in series to said first transistor for controlling current to flow through said third transistor.

15. An FM demodulation circuit as claimed in claim 6, wherein said electric field strength detection circuit outputs a voltage which increases in inverse proportion to the level of the input signal, and said control current source circuit includes a differential amplifier including a first transistor and a second transistor-which receives at an input thereof a predetermined reference voltage, an OTA reference current source for outputting predetermined control current, a third transistor for adding predetermined current to the output current of said OTA reference current source, and a fourth transistor connected in series to said first transistor for controlling current to flow through said third transistor.

16. An FM demodulation circuit as claimed in claim 7, wherein said electric field strength detection circuit outputs a voltage which increases in inverse proportion to the level of the input signal, and said control current source circuit includes a differential amplifier including a first transistor and a second transistor which receives at an input thereof a predetermined reference voltage, an OTA reference current source for outputting predetermined control current, a third transistor for adding predetermined current to the output current of said OTA reference current source, and a fourth transistor connected in series to said first transistor for controlling current to flow through said third transistor.

17. An FM demodulation circuit as claimed in claim 8, wherein said electric field strength detection circuit outputs a voltage which increases in inverse proportion to a level of the input signal, and said control current source circuit includes a differential amplifier including a first transistor and a second transistor which receives at an input thereof a predetermined reference voltage, an OTA reference current source for outputting predetermined control current, a third transistor for shunting output current of said OTA reference current source, a fourth transistor for controlling current to flow through said third transistor, a fifth transistor for controlling current to flow through said fourth transistor, and a sixth transistor connected in series to said third transistor for controlling current to flow through said fifth transistor.

18. An FM demodulation circuit as claimed in claim 9, wherein said electric field strength detection circuit outputs a voltage which increases in inverse proportion to a level of the input signal, and said control current source circuit includes a differential amplifier including a first transistor and a second transistor which receives at an input thereof a predetermined reference voltage, an OTA reference current source for outputting predetermined control current, a third transistor for shunting output current of said OTA reference current source, a fourth transistor for controlling current to flow through said third transistor, a fifth transistor for controlling current to flow through said fourth transistor, and a sixth transistor connected in series to said third transistor for controlling current to flow through said fifth transistor.

19. An FM demodulation circuit as claimed in claim 10, wherein said electric field strength detection circuit outputs a voltage which increases in inverse proportion to a level of the input signal, and said control current source circuit includes a differential amplifier including a first transistor and a second transistor which receives at an input thereof a predetermined reference voltage, an OTA reference current source for outputting predetermined control current, a third transistor for shunting output current of said OTA reference current source, a fourth transistor for controlling current to flow through said third transistor, a fifth transistor for controlling current to flow through said fourth transistor, and a sixth transistor connected in series to said third transistor for controlling current to flow through said fifth transistor.

20. An FM demodulation circuit as claimed in claim 11, wherein said electric field strength detection circuit outputs a voltage which increases in inverse proportion to a level of the input signal, and said control current source circuit includes a differential amplifier including a first transistor and a second transistor which receives at an input thereof a predetermined reference voltage, an OTA reference current source for outputting predetermined control current, a third transistor for shunting output current of said OTA reference current source, a fourth transistor for controlling current to flow through said third transistor, a fifth transistor for controlling current to flow through said fourth transistor, and a sixth transistor connected in series to said third transistor for controlling current to flow through said fifth transistor.

* * * * *

UNITED STATES PATENT AND TRADEMARK OFFICE
CERTIFICATE OF CORRECTION

PATENT NO. : 6,020,784
DATED : February 1, 2000
INVENTOR(S) : Tomihiro Fujii

It is certified that error appears in the above-identified patent and that said Letters Patent is hereby corrected as shown below:

Column 1, Line 16: "are-available" should read --are available--

Column 8, Line 46: "$V_r$" should read --$V_t$--

Column 8, Line 55: "$V_r$" should read --$V_t$--

Column 8, Line 62: "$V_r$" should read --$V_t$--

Column 12, Line 46: "$V_r$" should read --$V_+$--

Column 12, Line 54: "$V_r$" should read --$V_+$--

Column 14, Line 1: "$Z_{in} = 3R50/j\omega C52 x R_s = kx1/j\omega C52$ (20)"

should read --$Z_{in} = 3R50/j\omega C52 x R_s = kx1/j x C52$ (20)

Column 14, Line 55: "Zi" should read --Z1--

Column 16, Line 7: "out put" should read --output--

Column 19, Line 51: "transistor-which" should read --transistor which--

Signed and Sealed this

Twenty-seventh Day of March, 2001

*Attest:*

NICHOLAS P. GODICI

*Attesting Officer*   *Acting Director of the United States Patent and Trademark Office*